(12) United States Patent
Xu et al.

(10) Patent No.: US 11,430,864 B2
(45) Date of Patent: Aug. 30, 2022

(54) VFET DEVICE WITH CONTROLLABLE TOP SPACER

(71) Applicant: International Business Machines Corporation, Armonk, NY (US)

(72) Inventors: Wenyu Xu, Albany, NY (US); Chen Zhang, Guilderland, NY (US); Kangguo Cheng, Schenectady, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/777,557

(22) Filed: Jan. 30, 2020

(65) Prior Publication Data

US 2020/0168702 A1    May 28, 2020

Related U.S. Application Data

(62) Division of application No. 16/031,424, filed on Jul. 10, 2018, now Pat. No. 10,593,753.

(51) Int. Cl.
*H01L 29/06* (2006.01)
*H01L 29/66* (2006.01)
(Continued)

(52) U.S. Cl.
CPC ...... *H01L 29/0653* (2013.01); *H01L 29/0847* (2013.01); *H01L 29/6653* (2013.01); *H01L 29/66666* (2013.01); *H01L 29/7827* (2013.01); *H01L 21/31111* (2013.01); *H01L 21/76837* (2013.01); *H01L 23/5329* (2013.01)

(58) Field of Classification Search
CPC .......... H01L 29/66666; H01L 29/0847; H01L 29/6653; H01L 29/66787; H01L 29/7827; H01L 29/0653; H01L 21/31111; H01L 21/76837; H01L 23/5329
See application file for complete search history.

(56) References Cited

U.S. PATENT DOCUMENTS 7,544,594 B2   6/2009 Change
8,728,881 B2   5/2014 Zhu et al.
(Continued)

OTHER PUBLICATIONS

List of IBM Patents or Applications Treated as Related (2 pages).

*Primary Examiner* — Patricia D Valenzuela
(74) *Attorney, Agent, or Firm* — Samuel Waldbaum; Michael J. Chang, LLC

(57) ABSTRACT

Techniques for controlling top spacer thickness in VFETs are provided. In one aspect, a method of forming a VFET device includes: depositing a dielectric hardmask layer and a fin hardmask(s) on a wafer; patterning the dielectric hardmask layer and the wafer to form a fin(s) and a dielectric cap on the fin(s); forming a bottom source/drain at a base of the fin(s); forming bottom spacers on the bottom source/drain; forming a gate stack alongside the fin(s); burying the fin(s) in a dielectric fill material; selectively removing the fin hardmask(s); recessing the gate stack to form a cavity in the dielectric fill material; depositing a spacer material into the cavity; recessing the spacer material to form top spacers; removing the dielectric cap; and forming a top source/drain at a top of the fin(s). A VFET device is also provided.

20 Claims, 5 Drawing Sheets

(51) Int. Cl.
  *H01L 29/78*   (2006.01)
  *H01L 29/08*   (2006.01)
  *H01L 21/311*   (2006.01)
  *H01L 23/532*   (2006.01)
  *H01L 21/768*   (2006.01)

(56) References Cited

U.S. PATENT DOCUMENTS

| | | |
|---|---|---|
| 9,337,315 B2 | 5/2016 | Basker et al. |
| 9,418,897 B1 | 8/2016 | Ching et al. |
| 9,536,793 B1 * | 1/2017 | Zhang ............. H01L 21/823828 |
| 9,780,197 B1 | 10/2017 | Xie et al. |
| 2007/0090443 A1 | 4/2007 | Choi et al. |
| 2018/0012993 A1 | 1/2018 | Cheng et al. |
| 2018/0053843 A1 | 2/2018 | Anderson et al. |
| 2018/0090598 A1 * | 3/2018 | Xie ..................... H01L 29/7827 |
| 2018/0350695 A1 * | 12/2018 | Cheng ................. H01L 29/0676 |
| 2019/0058047 A1 * | 2/2019 | Cheng ............... H01L 29/42376 |
| 2019/0157452 A1 * | 5/2019 | Kim ................. H01L 29/78642 |

* cited by examiner

VFET DEVICE WITH CONTROLLABLE TOP SPACER

CROSS-REFERENCE TO RELATED APPLICATIONS

This application is a divisional of U.S. application Ser. No. 16/031,424 filed on Jul. 10, 2018, now U.S. Pat. No. 10,593,753, the contents of which are incorporated by reference herein.

FIELD OF THE INVENTION

The present invention relates to vertical field effect transistors (VFETs), and more particularly, to techniques for controlling top spacer thickness in VFETs.

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. VFETs have been pursued as a potential device option for continued CMOS scaling.

Bottom and top spacers offset the bottom and top source/drains, respectively, from the VFET gate. However, the processes typically employed to define the top spacer depend on the dimensions at the top of the fin (which can vary from fin-to-fin due to process variations), thus making the thickness of the top spacer extremely hard to control. Variations in the top spacer thickness can undesirably lead to a higher risk of gate to source/drain short, reliability concerns due to breakdown, variation of the gate to source/drain capacitance, as well as make it difficult to set the junction to be close to the gated region.

Therefore, improved VFET fabrication techniques that control a thickness of the top spacer would be desirable.

SUMMARY OF THE INVENTION

The present invention provides techniques for controlling top spacer thickness in vertical field effect transistors (VFETs). In one aspect of the invention, a method of forming a VFET device is provided. The method includes: depositing a dielectric hardmask layer on a wafer; forming at least one fin hardmask on the dielectric hardmask layer; patterning the dielectric hardmask layer and the wafer using the at least one fin hardmask to form at least one fin in the wafer and a dielectric cap on the at least one fin; forming a bottom source and drain in the wafer at a base of the at least one fin; forming bottom spacers on the bottom source and drain; forming a gate stack alongside the at least one fin; burying the at least one fin in a dielectric fill material; selectively removing the at least one fin hardmask; recessing the gate stack to form a cavity in the dielectric fill material at a top of the at least one fin; depositing a spacer material into the cavity; recessing the spacer material to form top spacers on the gate stack; removing the dielectric cap; and forming a top source and drain at a top of the at least one fin.

In another aspect of the invention, a VFET device is provided. The VFET device includes: at least one fin patterned in a wafer; a bottom source and drain formed in the wafer at a base of the at least one fin; bottom spacers disposed on the bottom source and drain; a gate stack alongside the at least one fin; a dielectric fill material surrounding the at least one fin; a cavity in the dielectric fill material at a top of the at least one fin; top spacers in the cavity above the gate stack; and a top source and drain at a top of the at least one fin, wherein the top source and drain has a topography with a peak at a center of the top source and drain and down-sloping surfaces to either side of the peak.

A more complete understanding of the present invention, as well as further features and advantages of the present invention, will be obtained by reference to the following detailed description and drawings.

DETAILED DESCRIPTION OF PREFERRED EMBODIMENTS

As provided above, controlling the thickness of the top spacer during vertical field effect transistor (VFET) device fabrication can be challenging. For instance, as will be described in detail below, fin hardmasks are employed to pattern the vertical fin channel of the VFET device. The various layers of the VFET device are then formed, such as the bottom source and drains, bottom spacers, gate stack, etc. To form the top spacer, one could then deposit a liner material over the device and fin hardmask, and then etch back the liner/fin hardmask at the top of the fin to form the top spacers. However, fin-to-fin variation in the height of the fin hardmask is inevitable, which affects the etch-back depth, and thus the final thickness of the top spacers.

Advantageously, provided herein are VFET fabrication techniques wherein the top spacers are formed by etching back from a fixed distance determined by film thickness, which produces less variation. Namely, as will be described in detail below, the present techniques include forming a cavity at the top of the fin above the gate stack, depositing a (top spacer) dielectric to pinch off the cavity, and then etching back the dielectric to form the top spacer. Notably, the fin hardmask is removed prior to forming the cavity. Thus, the potential for variations from differing fin hardmask heights is eliminated. Further, as a result of the present novel process, a unique top source and drains pointed profile is achieved, advantageously increasing the surface area of the top source and drains.

Figure 1:
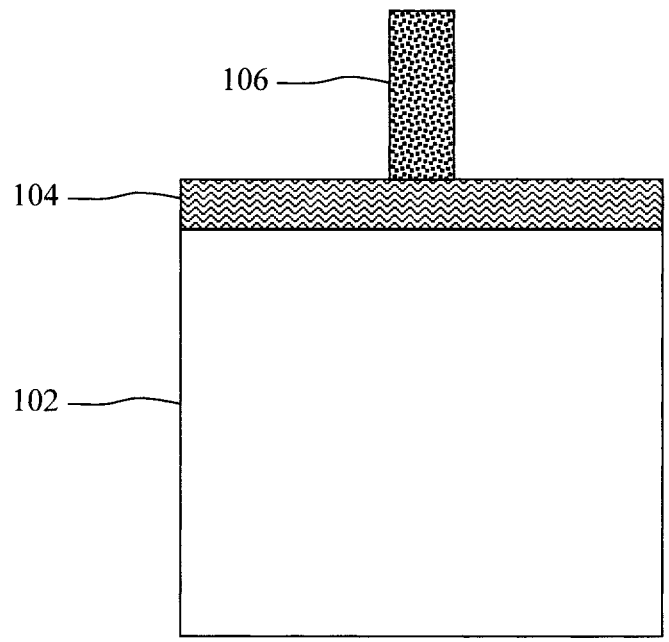
FIG. 1 is a cross-sectional diagram illustrating a thin dielectric hardmask layer having been deposited onto a wafer, and at least one fin hardmask having been formed on the dielectric hardmask layer according to an embodiment of the present invention.

An exemplary embodiment of the present techniques is now described by way of reference to FIGS. 1-10 which illustrate a methodology for forming a VFET device. As shown in FIG. 1, the process begins with a wafer 102 in which at least one fin will be patterned.

According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Next, a thin dielectric hardmask layer 104 is deposited onto the wafer 102. According to an exemplary embodiment, dielectric hardmask layer 104 is deposited to a thickness of from about 2 nanometers (nm) to about 15 nm and ranges therebetween. A qualification of the dielectric hardmask layer 104 is that it provides etch selectivity to the fin hardmasks (to be formed below). Suitable materials for the dielectric hardmask layer 104 include, but are not limited to, oxide hardmask materials such as silicon oxycarbide (SiOC), and/or silicon dioxide ($SiO_2$).

At least one fin hardmask 106 is then formed on the dielectric hardmask layer 104. The fin hardmask(s) 106 mark the footprint and location of at least one fin that is to be patterned in the wafer 102. To form the fin hardmask(s) 106, a suitable hardmask material is first deposited onto the dielectric hardmask layer 104. Standard lithography and etching techniques are then used to pattern the hardmask material into the individual hardmask(s) as shown in FIG. 1. Suitable fin hardmask materials include, but are not limited to, nitride hardmask materials such as silicon nitride (SiN) and/or silicon-boron-nitride (SiBN). As provided above, etch selectivity is needed between the dielectric hardmask layer 104 and the fin hardmasks 106. The use of oxide and nitride hardmask materials, respectively, provides such selectivity. This configuration will enable removal of the fin hardmasks 106 selective to the dielectric hardmask layer 104 later on in the process.

Figure 2:
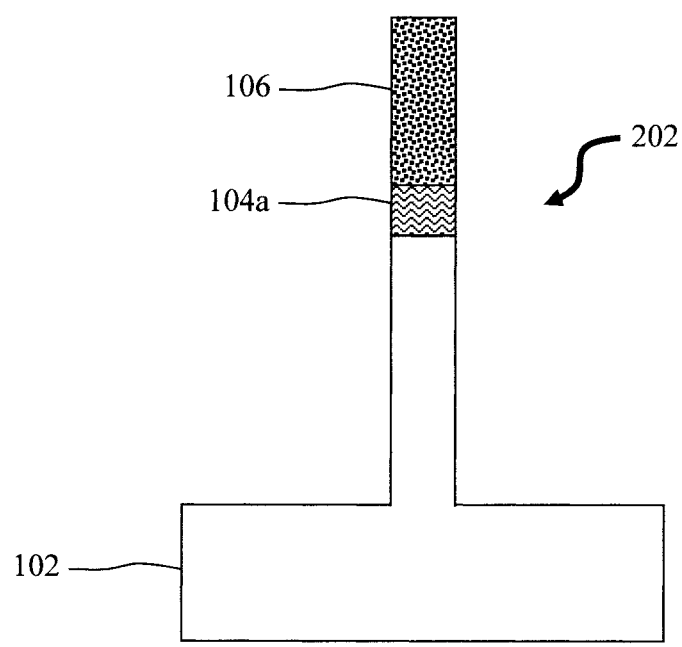
FIG. 2 is a cross-sectional diagram illustrating the fin hardmask(s) having been used to pattern the dielectric hardmask layer and at least one fin in the wafer, wherein the patterned portion of the dielectric hardmask layer forms a dielectric cap on the fin(s) according to an embodiment of the present invention.

Next, as shown in FIG. 2, the fin hardmask(s) 106 is then used to pattern the dielectric hardmask layer 104 and at least one fin 202 in the wafer 102. The patterned portion of the dielectric hardmask layer 104 forms a dielectric cap 104a on the fin 202. A directional (anisotropic) etching process such as reactive ion etching (RIE) can be used for the fin etch. As shown in FIG. 2, the fin(s) 202 as patterned extend completely through the dielectric hardmask layer 104 and partway through the wafer 102. It is notable that, while a single fin 202 is shown in the present example, multiple fins 202 can be formed in the same manner described.

Figure 3:
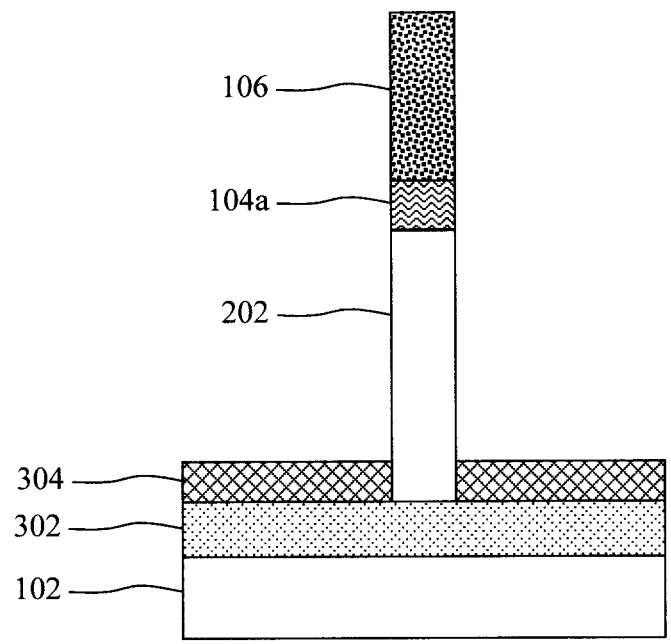
FIG. 3 is a cross-sectional diagram illustrating a bottom source and drain having been formed in the wafer at the base of the fin(s), and bottom spacers having been formed on the bottom source and drain according to an embodiment of the present invention.

As shown in FIG. 3, a bottom source and drain 302 is then formed in the wafer 102 at the base of the fin(s) 202. According to one exemplary embodiment, the bottom source and drain 302 is formed using ion implantation. Suitable n-type dopants include phosphorous and/or arsenic, and suitable p-type dopants include, but are not limited to, boron. Alternatively, a thermally-driven diffusion of dopants from a highly-doped epitaxial material (such as phosphorous-doped epitaxial Si (Si:P) or boron-doped epitaxial SiGe (SiGe:B)) deposited between the fins (not shown) can instead be used to form the bottom source and drain 302. This technique is described, for example, in U.S. patent application Ser. No. 15/713,975 by Li et al., entitled "Vertical FET with Sharp Junctions," the contents of which are incorporated by reference as if fully set forth herein.

Bottom spacers 304 are then formed on the bottom source and drain 302. According to an exemplary embodiment, the bottom spacers 304 are formed using a directional deposition process whereby the spacer material is deposited onto the bottom source and drain 302, fin hardmasks 106 and fins 202 with a greater amount of the material being deposited on horizontal surfaces (including on top of the bottom source and drain 302 in between the fins 202), as compared to vertical surfaces (such as along sidewalls of the fins 202). Thus, when an etch is used on the spacer material, the timing of the etch needed to remove the spacer material from the vertical surfaces will leave the bottom spacers 304 shown in FIG. 3 on the bottom source and drain 302 since a greater amount of the spacer material was deposited on the bottom source and drain 302. By way of example only, a high-density plasma (HDP) chemical vapor deposition (CVD) or physical vapor deposition (PVD) process can be used for directional film deposition. Suitable materials for the bottom spacers 304 include, but are not limited to, oxide spacer materials such as silicon dioxide ($SiO_2$) and/or SiOC, and/or nitride spacer materials such as SiN and/or silicon-boron-nitride (SiBN). In that case, an oxide- or nitride-selective isotropic etch can be used to remove the (thinner) spacer material deposited onto the vertical surfaces. According to an exemplary embodiment, the bottom spacers 304 are formed having a thickness of from about 2 nm to about 15 nm and ranges therebetween.

Figure 4:
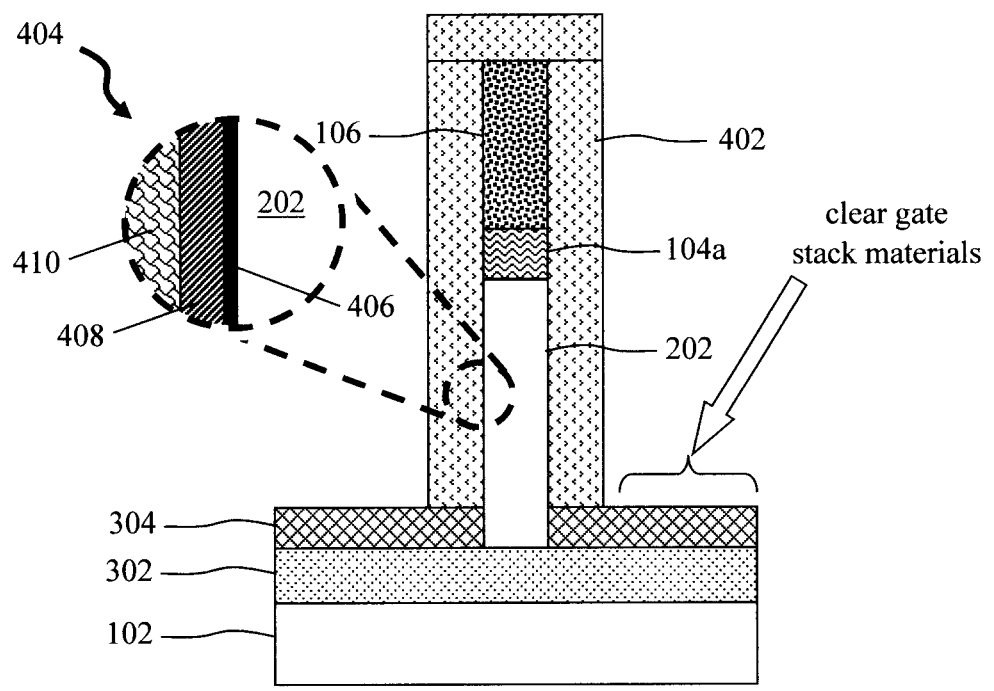
FIG. 4 is a cross-sectional diagram illustrating a gate stack having been formed alongside the fin(s) according to an embodiment of the present invention.
Figure 5:
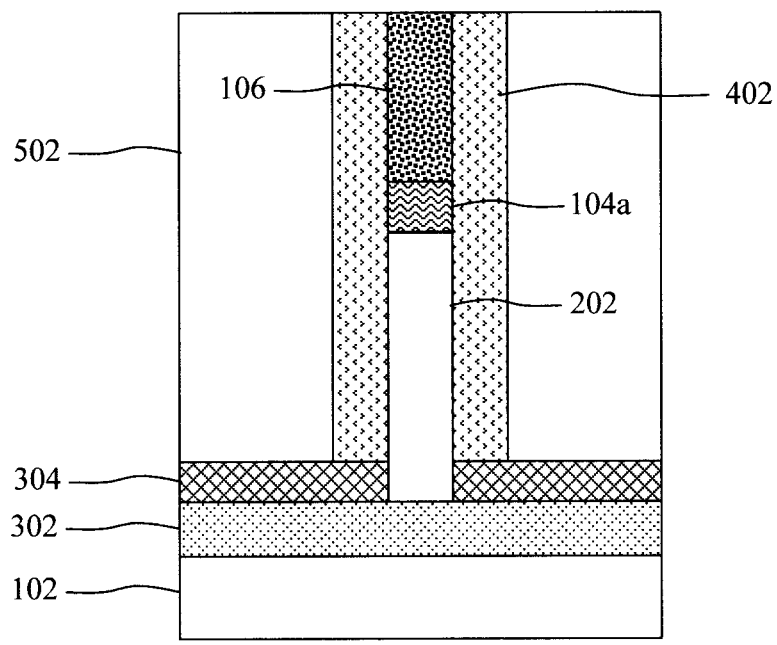
FIG. 5 is a cross-sectional diagram illustrating the fin(s) and gate stack having been buried/surrounded in a dielectric fill material according to an embodiment of the present invention.

A gate stack 402 is then formed alongside the fin 202. See FIG. 4. To do so, as shown in FIG. 4 the gate stack 402 is deposited as a series of conformal layer(s) (i.e., in a stack) over the fin(s) 202/fin hardmask(s) 106. A conformal deposition process would deposit the gate stack materials on top of the bottom spacers 304. However, an etch (e.g., RIE) is then used to clear the gate stack materials from the bottom spacers 304 in order to prevent shorting between adjacent devices.

As shown in magnified view 404, gate stack 402 includes an interfacial oxide 406 on exposed surfaces of the fin 202, a gate dielectric 408 disposed on the fin 202 over the interfacial oxide 406, and a gate conductor 410 disposed on the gate dielectric. Interfacial oxide 406 can be formed on the exposed surfaces of the fin 202 by an oxidation process. According to an exemplary embodiment, interfacial oxide 406 is formed having a thickness of from about 0.3 nanometers (nm) to about 5 nm and ranges therebetween, e.g., about 1 nm.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide (HfO$_2$) rather than 3.9 for SiO$_2$). Suitable high-κ materials include, but are not limited to, metal oxides such as hafnium oxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium oxide (ZrO$_2$), zirconium silicon oxide (ZrSiO$_4$), zirconium silicon oxynitride (ZrSiOxNy), tantalum oxide (TaOx), titanium oxide (TiO), barium strontium titanium oxide (BaO$_6$SrTi$_2$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$), and/or lead zinc niobite (Pb(Zn,Nb)O). The high-κ dielectric can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, the gate dielectric 408 has a thickness of from about 1 nm to about 5 nm and ranges therebetween, although less thicknesses and greater thicknesses are also conceived.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. According to an exemplary embodiment, the gate conductor 410 has a thickness of from about 5 nm to about 20 nm and ranges therebetween, although less thicknesses and greater thicknesses are also conceived.

The fin 202/gate stack 402 are then buried/surrounded in a dielectric fill material 502. See FIG. 5. Suitable dielectric fill materials include, but are not limited to, SiO$_2$. A planarizing process such as chemical-mechanical polishing (CMP) is then used to polish the dielectric fill material 502 (and gate stack materials at the top of the fin 202) down to the fin hardmask 106. Doing so, exposes the fin hardmask 106 enabling the fin hardmask 106 to be selectively removed.

Figure 6:
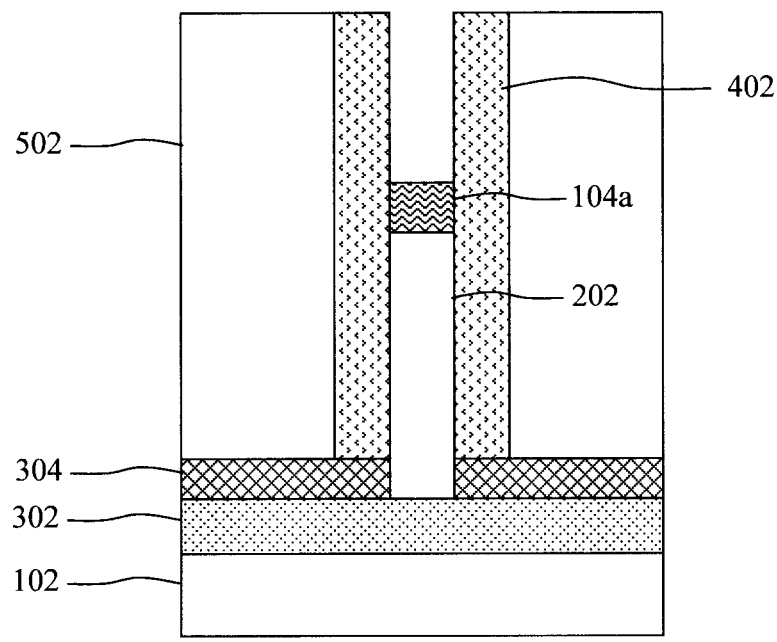
FIG. 6 is a cross-sectional diagram illustrating the fin hardmask(s) having been removed selective to the dielectric cap according to an embodiment of the present invention.
Figure 7:
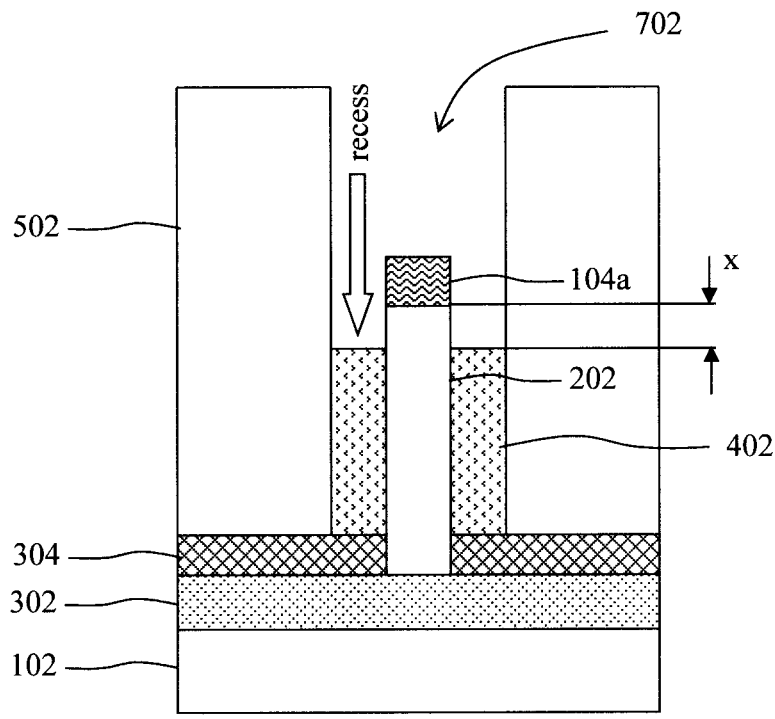
FIG. 7 is a cross-sectional diagram illustrating the gate stack having been recessed to its desired height, which forms a cavity in the dielectric fill material at the top of the fin(s) according to an embodiment of the present invention.

Namely, as shown in FIG. 6, the fin hardmask 106 is next removed selective to the dielectric cap 104a. As provided above, there is etch selectivity between the fin hardmask 106 and the patterned dielectric hardmask layer 104/dielectric cap 104a. For instance, the fin hardmask 106 can be formed from a nitride hardmask material, while the dielectric cap 104a is formed from an oxide hardmask material. In that case, a nitride selective etching process such as a nitride-selective RIE can be used to remove the fin hardmask 106.

The next task is to recess the gate stack 402 to its desired height, which forms a cavity 702 in the dielectric fill material 502 at the top of the fin 202 over the (recessed) gate stack 402. See FIG. 7. According to an exemplary embodiment, the gate stack 402 recess is performed using a non-directional (isotropic) etching process such as a wet etch. The desired (recess) height of the gate stack 402 is below the top surface of the fin 202 (e.g., see in FIG. 7 where the gate stack 402 is recessed a distance x below the top surface of the fin 202). That way, the top source and drains (to be formed below) will be separated from the gate stack by the top spacers, which are next formed in the cavity 702. According to an exemplary embodiment, x is from about 2 nm to about 15 nm and ranges therebetween.

Figure 8:
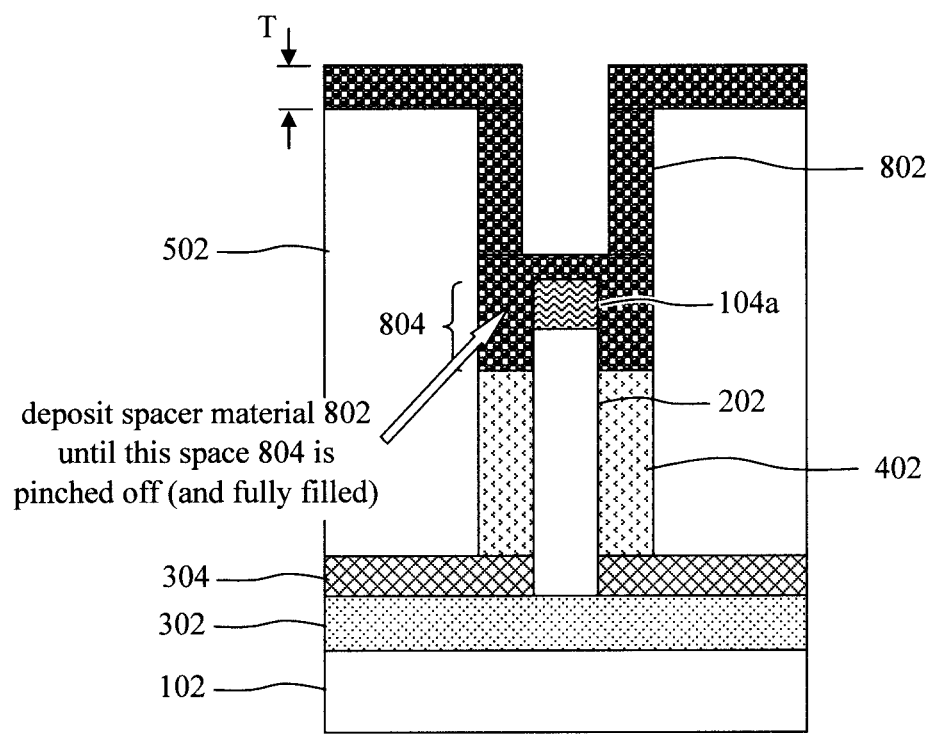
FIG. 8 is a cross-sectional diagram illustrating a spacer material having been deposited into the cavity on the top of the fin(s) over the dielectric cap according to an embodiment of the present invention.

Namely, as shown in FIG. 8 a spacer material 802 is deposited into the cavity on the top of the fin 202 (over dielectric cap 104a). According to an exemplary embodiment, the spacer material 802 is deposited using a conformal deposition process (such as ALD or CVD) until the spacer material 802 pinches off the space between the fin 202/dielectric cap 104a and the sidewalls of the cavity 702. Suitable spacer materials 802 include, but are not limited to, nitride spacer materials such as SiN and/or SiBN. The spacer material 802 needs to be different from the dielectric cap 104a.

As shown in FIG. 8, the spacer material 802 deposited in this manner has a thickness T. According to an exemplary embodiment, T is from about 3 nm to about 10 nm and ranges therebetween. This (starting) thickness T of spacer material 802 less an etch back amount (needed to define the top spacers) equals a final thickness T' of the top spacers.

Figure 9:
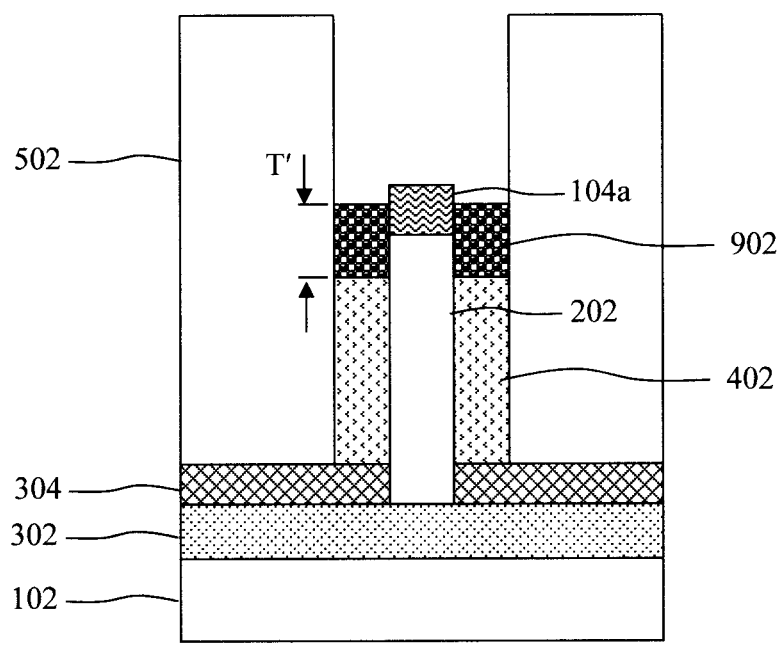
FIG. 9 is a cross-sectional diagram illustrating a recess etch of the spacer material having been performed to form top spacers on the gate stack according to an embodiment of the present invention.

Namely, as shown in FIG. 9 a recess etch of the spacer material 802 is next performed to form top spacers 902 on the gate stack 402. According to an exemplary embodiment, this recess etch of the spacer material 802 is performed using a non-directional (isotropic) etching process such as a wet etch. The timing of the etch back can be controlled such that the etch is endpointed when the spacer material 802 has been cleared from the sidewalls (above the space 804) of the cavity 702. If the spacer material 802 has a uniform thickness T, then the etch back amount to clear T will also be uniform across all devices. Accordingly, the final thickness T' of the top spacers 902 (i.e., T less the etch back amount) will be uniform. According to an exemplary embodiment, T' is from about 2 nm to about 20 nm and ranges therebetween.

Figure 10:
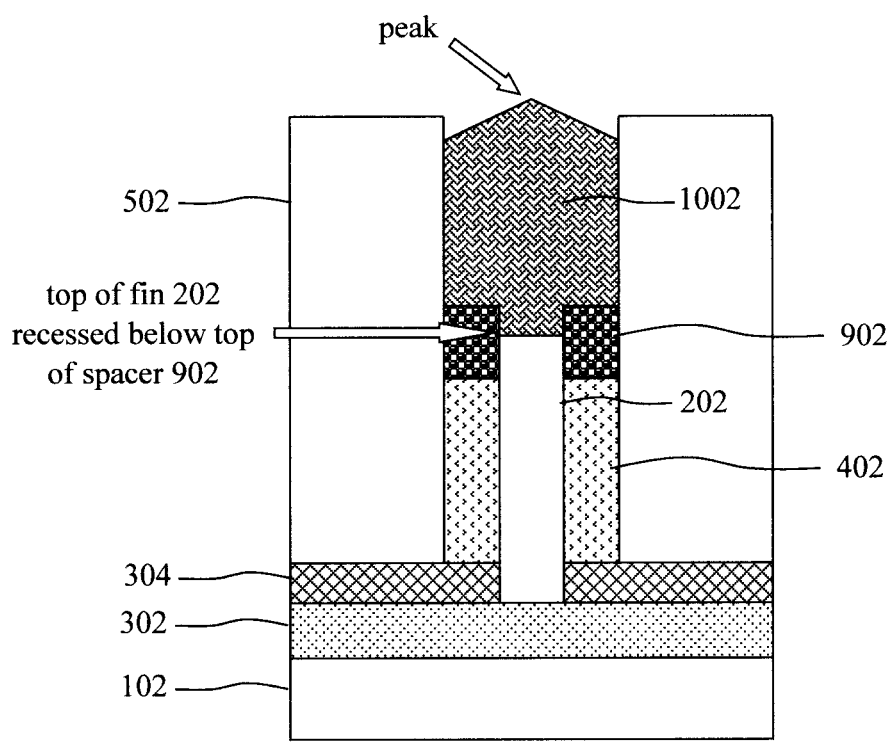
FIG. 10 is a cross-sectional diagram illustrating the dielectric cap having been removed, and a top source and drain having been grown at the top of the fin(s) according to an embodiment of the present invention.

Finally, as shown in FIG. 10 the dielectric cap 104a is removed, and a top source and drain 1002 is grown at the top of the fin 202. As provided above, the patterned dielectric hardmask layer 104/dielectric cap 104a can be formed from an oxide material. In that case, an oxide-selective etching process such as an oxide-selective RIE can be used to remove the dielectric cap 104a.

According to an exemplary embodiment, the top source and drain 1002 is formed from a doped epitaxial material grown at the top of the fin 202. Suitable source and drain doped epitaxial materials include, but are not limited to, phosphorous-doped epitaxial Si (Si:P) or boron-doped epitaxial SiGe (SiGe:B).

It is notable that the present process results in a unique contour of the top source and drain 1002. For instance, removal of the dielectric cap 104a leaves the top of the fin 202 recessed below the tops of the spacer 902. Epitaxial growth of the top source and drain 1002 occurs from the top of the fin 202. As such growth will begin over the recessed top surface of fin 202 between the top spacers 902. As the growth progresses and expands into cavity 702, the profile of the initial growth at the center of the cavity 702 on the fin 202 will translate to the source and drain 1002 having the peaked topography shown in FIG. 10. Namely, as shown in FIG. 10, the top source and drain 1002 has a top topography with a point/peak at the center and down-sloping surfaces to either side of the peak. Further, a portion of the bottom surface of the top source and drain 1002 is recessed below the tops of spacers 902. See FIG. 10.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field effect transistor (VFET) device, comprising:
   at least one fin patterned in a wafer;
   a bottom source and drain formed in the wafer at a base of the at least one fin;
   bottom spacers disposed on the bottom source and drain;
   a gate stack alongside the at least one fin;
   top spacers above the gate stack;
   a top source and drain at a top of the at least one fin, wherein the top source and drain has vertical outer sidewalls and a topography with a peak at a center of the top source and drain and down-sloping surfaces to either side of the peak connecting the peak to the vertical outer sidewalls, and wherein the top source and drain is disposed over, and in contact with, a top surface of the top spacers; and
   a dielectric fill material surrounding the at least one fin and the top source and drain at the top of the at least one fin, wherein the dielectric fill material directly contacts both the top spacers and the vertical outer sidewalls of the top source and drain.

2. The VFET device of claim 1, wherein a portion of a bottom surface of the top source and drain is recessed below a top of the top spacers.

3. The VFET device of claim 1, wherein the gate stack comprises:
   an interfacial oxide on exposed surfaces of the at least one fin;
   a gate dielectric disposed on the at least one fin over the interfacial oxide; and
   a gate conductor disposed on the gate dielectric.

4. The VFET device of claim 3, wherein the gate dielectric comprises a material selected from the group consisting of: silicon oxide (SiOx), silicon nitride (SiN), silicon oxynitride (SiOxNy), a high-κ material, and combinations thereof.

5. The VFET device of claim 3, wherein the gate dielectric comprises a high-κ material selected from the group consisting of: hafnium oxide ($HfO_2$), hafnium silicon oxide (HMO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc, Ta)o_3$), lead zinc niobite (Pb(Zn,Nb)O), and combinations thereof.

6. The VFET device of claim 3, wherein the gate conductor comprises a material selected from the group consisting of: doped polycrystalline or amorphous silicon (Si), doped polycrystalline or amorphous germanium (Ge), doped polycrystalline or amorphous silicon germanium (SiGe), tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), $Ti_3Al$, ZrAl, TaC, TaMgC, carbon nanotubes, conductive carbon, graphene, and combinations thereof.

7. The VFET device of claim 1, wherein the gate stack is recessed below a top surface of the at least one fin.

8. The VFET device of claim 7, wherein the gate stack is recessed a distance x below the top surface of the at least one fin, and wherein x is from about 2 nm to about 15 nm and ranges therebetween.

9. The VFET device of claim 1, wherein the bottom spacers and the top spacers each comprise a material selected from the group consisting of silicon dioxide ($SiO_2$), silicon oxycarbide (SiOC), silicon nitride (SiN), silicon-boron-nitride (SiBN), and combinations thereof.

10. The VFET device of claim 1, wherein the top of the at least one fin is recessed below a top of the top spacers, and wherein a sidewall of each of the top spacers and one of the vertical outer sidewalls of the top source and drain both directly contact a same vertical surface of the dielectric fill material.

11. The VFET device of claim 1, wherein the dielectric fill material comprises $SiO_2$.

12. A VFET device, comprising:
   at least one fin patterned in a wafer;
   a bottom source and drain formed in the wafer at a base of the at least one fin;
   bottom spacers disposed on the bottom source and drain;
   a gate stack alongside the at least one fin;
   top spacers above the gate stack, wherein the top of the at least one fin is recessed below a top of the top spacers;
   a top source and drain at a top of the at least one fin, wherein the top source and drain has vertical outer sidewalls and a topography with a peak at a center of the top source and drain and down-sloping surfaces to either side of the peak connecting the peak to the vertical outer sidewalls, wherein a portion of a bottom surface of the top source and drain is recessed below a top of the top spacers, and wherein the top source and drain is disposed over, and in contact with, a top surface of the top spacers; and a dielectric fill material surrounding the at least one fin and the top source and drain at the top of the at least one fin, wherein the dielectric fill material directly contacts both the top spacers and the vertical outer sidewalls of the top source and drain.

13. The VFET device of claim 12, wherein the gate stack comprises:
   an interfacial oxide on exposed surfaces of the at least one fin;
   a gate dielectric disposed on the at least one fin over the interfacial oxide; and
   a gate conductor disposed on the gate dielectric.

14. The VFET device of claim 13, wherein the gate dielectric comprises a material selected from the group consisting of: SiOx, SiN, SiOxNy, a high-κ material, and combinations thereof.

15. The VFET device of claim 13, wherein the gate dielectric comprises a high-κ material selected from the group consisting of: $HfO_2$, HfSiO, HfSiO, $La_2O_3$, $LaAlO_3$, $ZrO_2$, $ZrSiO_4$, ZrSiOxNy, TaOx, TiO, $BaO_6SrTi_2$, $BaTiO_3$, $SrTiO_3$, $Y_2O_3$, $Al_2O_3$, $Pb(Sc,Ta)O_3$, Pb(Zn,Nb)O, and combinations thereof.

16. The VFET device of claim 13, wherein the gate conductor comprises a material selected from the group consisting of: doped polycrystalline or amorphous Si, doped polycrystalline or amorphous Ge, doped polycrystalline or amorphous SiGe, W, Ti, Ta, Ru, Hf, Zr, Co, Ni, Cu, Al, Pt, Sn, Ag, Au, TaN, TiN, TaC, TiC, TiAlC, WSi, WN, $RuO_2$, CoSi, NiSi, $Ti_3Al$, ZrAl, TaC, TaMgC, carbon nanotubes, conductive carbon, graphene, and combinations thereof.

17. The VFET device of claim 12, wherein the gate stack is recessed below a top surface of the at least one fin.

18. The VFET device of claim 17, wherein the gate stack is recessed a distance x below the top surface of the at least one fin, and wherein x is from about 2 nm to about 15 nm and ranges therebetween.

19. The VFET device of claim 12, wherein the bottom spacers and the top spacers each comprise a material selected from the group consisting of: $SiO_2$, SiOC, SiN, SiBN, and combinations thereof.

20. The VFET device of claim 12, wherein the dielectric fill material comprises $SiO_2$.

* * * * *